United States Patent
Romesburg

(10) Patent No.: US 8,229,137 B2
(45) Date of Patent: Jul. 24, 2012

(54) VOLUME CONTROL CIRCUITS FOR USE IN ELECTRONIC DEVICES AND RELATED METHODS AND ELECTRONIC DEVICES

(75) Inventor: Eric Douglas Romesburg, Chapel Hill, NC (US)

(73) Assignee: Sony Ericsson Mobile Communications AB, Lund (SE)

( * ) Notice: Subject to any disclaimer, the term of this patent is extended or adjusted under 35 U.S.C. 154(b) by 1543 days.

(21) Appl. No.: 11/513,719

(22) Filed: Aug. 31, 2006

(65) Prior Publication Data

US 2008/0075304 A1    Mar. 27, 2008

(51) Int. Cl.
H03G 3/00    (2006.01)

(52) U.S. Cl. ............ 381/107; 381/28; 381/98; 381/101; 381/102; 381/104; 381/106; 381/120; 455/232.1; 455/234.1

(58) Field of Classification Search ................... 381/104, 381/107, 28, 98, 101, 102, 106, 120; 455/232.1, 455/234.1; 330/199, 278, 279, 297
See application file for complete search history.

(56) References Cited

U.S. PATENT DOCUMENTS

| | | | |
|---|---|---|---|
| 5,303,308 A * | 4/1994 | Larsen et al. ............. | 381/106 |
| 5,701,352 A * | 12/1997 | Williamson, III ......... | 381/104 |
| 6,370,254 B1 * | 4/2002 | Gore et al. ............... | 381/104 |
| 2002/0133356 A1 | 9/2002 | Romesburg | |
| 2006/0106472 A1 | 5/2006 | Romesburg et al. | |
| 2006/0147049 A1 | 7/2006 | Bayley et al. | |
| 2006/0148435 A1 | 7/2006 | Romesburg et al. | |

FOREIGN PATENT DOCUMENTS

| | | |
|---|---|---|
| DE | 10 2004 016 184 A1 | 3/2005 |
| EP | 0 578 604 A1 | 1/1994 |

OTHER PUBLICATIONS

Office Action, European Patent Application No. 07752350.4, Apr. 29, 2010, 6 pages.
International Search Report and Written Opinion for PCT/US2007/005640; date of mailing Jul. 31, 2007.
First Office Action corresponding to Chinese Patent Application No. 200780032196.0 dated May 18, 2011; 24 pages.

* cited by examiner

*Primary Examiner* — Vivian Chin
*Assistant Examiner* — Paul Kim
(74) *Attorney, Agent, or Firm* — Myers Bigel Sibley & Sajovec

(57) ABSTRACT

Volume control circuits for use in electronic devices are provided. Some embodiments of the present invention provide volume control circuits for use in electronic devices. The volume control circuits include a gain circuit, a limiter circuit, a power measurement circuit and a gain adjustment circuit. The gain circuit is configured to receive an input audio signal and amplify the input audio signal based on a gain. The limiter circuit is configured to limit the amplified input audio signal based on a peak safety limit and output an output audio signal having a peak value based on the peak safety limit. The power measurement circuit is configured to measure a power level of the output audio signal. The power level has an associated power safety limit. The gain adjustment circuit is configured to adjust the gain of the gain circuit responsive to the measured power. Related methods and electronic devices are also provided herein.

23 Claims, 4 Drawing Sheets

VOLUME CONTROL CIRCUITS FOR USE IN ELECTRONIC DEVICES AND RELATED METHODS AND ELECTRONIC DEVICES

FIELD OF THE INVENTION

The present invention relates to audio systems for personal use, such as in portable electronic devices and, more particularly, to volume control circuits.

BACKGROUND OF THE INVENTION

Electronic devices, such as mobile terminals, are frequently used in a wide range of environments, which may have different noise levels. For example, an electronic device may be used in a relatively quiet office or home environment or within a relatively noisy public environment. In a noisy environment, it may be difficult for a user of the electronic device to hear therefrom music or the other party or parties. Typically, the volume or gain of the speaker of the electronic device can be manually increased to compensate, but such manual action by the user may be inconvenient.

Furthermore, some electronic devices include a volume limiter circuit that may be configured to limit the audio output of the speaker to a maximum allowed volume that will not damage a typical user's hearing even at the highest setting. Typically, conventional systems limit the maximum allowed volume by measuring and limiting only the peak or maximum signal level, which may cause users to complain that the sound is not loud enough. Thus, improved volume control circuits and methods may be desired.

SUMMARY OF THE INVENTION

Some embodiments of the present invention provide volume control circuits for use in electronic devices. The volume control circuits include a gain circuit, a limiter circuit, a power measurement circuit and a gain adjustment circuit. The gain circuit is configured to receive an input audio signal and amplify the input audio signal based on a gain. The limiter circuit is configured to limit the amplified input audio signal based on a peak safety limit and output an output audio signal having a peak value based on the peak safety limit. The power measurement circuit is configured to measure a power level of the output audio signal. The power level has an associated power safety limit. The gain adjustment circuit is configured to adjust the gain of the gain circuit responsive to the measured power level such that the power safety limit is not exceeded.

In further embodiments of the present invention, the gain adjustment circuit may be further configured to adjust the gain of the gain circuit responsive to the measured power level such that the power safety limit is not exceeded. The volume control circuit may further include a filter electrically coupled to an input of the power measurement circuit. The filter may be configured to filter the output audio signal and provide the filtered output audio signal to the power measurement circuit. In certain embodiments of the present invention, the filter may include an acoustic-model-based filter and/or an A-weighted filter.

In still further embodiments of the present invention, the gain circuit and the limiter circuit may be provided by a soft limiter.

In some embodiments of the present invention, the volume control circuit may include an ambient noise measurement circuit configured to measure ambient noise and provide a noise adaptive factor. A safety limit adjustment circuit may be configured to adjust the power safety limit of the power level based on the noise adaptive factor.

In some embodiments of the present invention, the power level may be a root mean square (RMS) power level. In certain embodiments of the present invention, the power level may be represented by a filtered value of an absolute value of samples of the output audio signal.

In further embodiments of the present invention, the gain of the gain circuit may be a function of various dynamic inputs. The gain adjustment module may be configured to gradually adjust the gain of the gain circuit responsive to the measured power level such that the adjustment appears seamless to a user. The input audio signal may be divided into frames and the gain adjustment circuit may be configured to adjust the gain once per frame.

Although some embodiments of the present invention are discussed above primarily with respect to volume control circuits, related methods and electronic devices are also provided herein.

DETAILED DESCRIPTION

Figure 1:
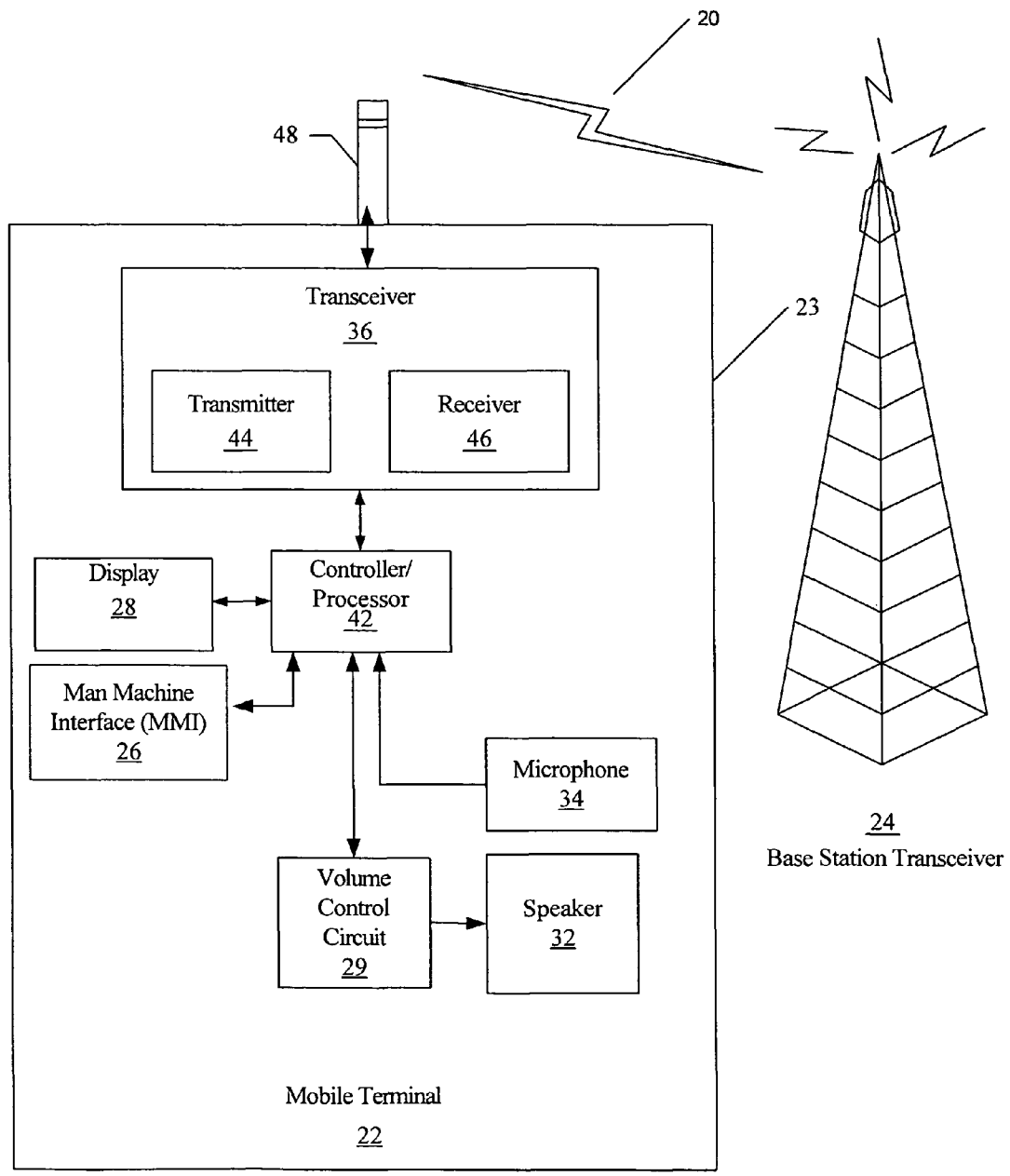
FIG. 1 is a schematic block diagram illustrating mobile terminals including volume control circuits according to some embodiments of the present invention.

Specific exemplary embodiments of the invention now will be described with reference to the accompanying drawings. This invention may, however, be embodied in many different forms and should not be construed as limited to the embodiments set forth herein; rather, these embodiments are provided so that this disclosure will be thorough and complete, and will fully convey the scope of the invention to those skilled in the art. The terminology used in the detailed description of the particular exemplary embodiments illustrated in the accompanying drawings is not intended to be limiting of the invention. In the drawings, like numbers refer to like elements.

As used herein, the singular forms "a", "an" and "the" are intended to include the plural forms as well, unless expressly stated otherwise. It will be further understood that the terms "includes," "comprises," "including" and/or "comprising," when used in this specification, specify the presence of stated features, integers, steps, operations, elements, and/or components, but do not preclude the presence or addition of one or more other features, integers, steps, operations, elements, components, and/or groups thereof. It will be understood that when an element is referred to as being "connected" or "coupled" to another element, it can be directly connected or coupled to the other element or intervening elements may be present. Furthermore, "connected" or "coupled" as used herein may include wirelessly connected or coupled. As used herein, the term "and/or" includes any and all combinations of one or more of the associated listed items.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

As used herein, an "electronic device" is any device that produces an audio signal. For example, an electronic device may be a home stereo, a car stereo or a portable electronic device, such as an MP3 player. In some embodiments of the present invention, a user may use headphones to listen to the audio signal produced by the electronic device. However, embodiments of the present invention are not limited to this configuration.

Some electronic devices include a volume limiter circuit that may be configured to limit the output of the speaker to a maximum allowed volume that will not damage a typical user's hearing even at the highest setting. Typically, conventional systems limit the maximum allowed volume by measuring and limiting only the peak or maximum signal level. However, studies have shown that the sound pressure safety limit for peak level is much higher than for the power level, for example, root mean square (RMS) level. Thus, the peak limit is typically set to a level that will produce a power level (RMS level) that is below the safe limit. In these conventional electronic devices, when the crest factor, i.e., the ratio of the peak limit to the RMS or power level, of a sound source is higher than minimum, for example, greater than 10 dB, the user may complain that the sound is not loud enough because the RMS or power level is limited to an unacceptably low level. For example, if the crest factor is 20 dB, the RMS level may be limited to 10 dB below the output when the crest factor is 10 dB, even though a higher RMS or power level may be equally safe for both crest factors.

Thus, as discussed further herein with respect to FIGS. 1 through 5, embodiments of the present invention provide volume control circuits, methods, and electronic devices for controlling volume in electronic devices. According to some embodiments of the present invention, both the peak level and the power level are considered when determining a volume of an output audio signal. In other words, some embodiments of the present invention, use both a peak safety limit and a power safety limit to determine how loud the output audio signal should be. Thus, if the power safety limit has not been reached, the volume of the output audio signal can be gradually increased until the power safety limit has been reached. This may allow the peak sound pressure limit to be set at the "true" safety limit, rather than unnecessarily low based on a conservative assumption about the crest factor. Thus, according to some embodiments of the present invention, the power (RMS) safety limit may be reached, even for higher crest factors and, therefore, the user may perceive that the volume (or loudness) of the device is sufficient even when a variety of music and/or phone call signal conditions are present as will be discussed further herein.

Referring first to FIG. 1, a schematic block diagram is provided illustrating a mobile terminal 22 including a volume control circuit 29 in accordance with some embodiments of the present invention. Although embodiments of the present invention are discussed herein with respect to the electronic device being a mobile terminal, it will be understood that embodiments of the present invention are not limited to this configuration. As discussed above, electronic devices according to some embodiments of the present invention may be any electronic device that produces an audio signal and, therefore, does not necessarily have to be a portable electronic device.

As used herein, a "mobile terminal" includes both devices having only a wireless signal receiver without transmit abilities and devices having both receive and transmit hardware capable of two-way communication over a two-way communication link. Such devices may include cellular or other communications devices with or without a multi-line display; Personal Communications System (PCS) terminals that may combine a voice and data processing, facsimile and/or data communications capabilities; Personal Digital Assistants (PDA) that can include a radio frequency receiver and a pager, Internet/Intranet access, Web browser, organizer, calendar and/or a global positioning system (GPS) receiver; and/or conventional laptop and/or palmtop computers or other appliances, which include a radio frequency receiver. As used herein, "mobile terminals" may be portable, transportable, installed in a vehicle (aeronautical, maritime, or land-based), or situated and/or configured to operate locally and/or in a distributed fashion at any other location(s) on earth and/or in space.

As illustrated in FIG. 1, a mobile terminal 22 communicates with a base station transceiver 24 of a wireless communications network 20. It will be understood that as wireless technologies evolve, so do "wireless communication networks." As used herein, a "wireless communication network" may refer to various radio access technologies in the traditional sense, a wireless local area network (LAN) or a wireless personal area network without departing from the teachings of the present invention. These networks may include, for example, radio access technologies, such as Code division multiple access (CDMA), Enhanced Data rates for GSM Evolution (EDGE), General Packet Radio Service (GPRS), Global System for Mobile TeleCommunications (GSM), High-Speed Downlink Packet Access (HSDPA), High-Speed Uplink Packet Access (HSUPA), Universal Mobile Telecommunications System (UMTS), Wideband Code Division Multiple Access (W-CDMA) and/or WCDMA+EDGE (WEDGE) and/or Wireless Local Area Networks (WLAN), such as Wireless Fidelity (WiFi) and Worldwide Interoperability for Microwave Access (WiMAX).

According to some embodiments of the present invention, radio access technologies and/or WLANs may be used as an access media between the mobile terminal 22 and the wireless communication network 20 illustrated in FIG. 1. For example, a mobile terminal 22 may also access a data network via UMTS, GSM, EDGE, GPRS, WEDGE, CDMA, WCDMA, HSDPA, HSUPA, WIFI, WiMAX and the like without departing from the scope of the present invention.

The mobile terminal 22 includes a portable housing 23 and may include, a man machine interface (MMI) 26, for example, a keyboard, touch pad and the like, a display 28, a speaker 32, a microphone 34, a transceiver 36, any of which may communicate with a controller (processor) 42. Furthermore, the mobile terminal 22 includes a volume control circuit 29 according to some embodiments of the present invention, which also communicates with the processor 42. The processor 42 can be any commercially available or custom microprocessor.

It will be understood that although the volume control circuit 29 is illustrated in the mobile terminal 22 as a single circuit, embodiments of the present invention are not limited to this configuration. For example, the volume control circuit 29 may be two or more circuits without departing from the scope of the present invention. Moreover, the volume control circuit 29 may be incorporated at least partially within the controller 42 or other illustrated components of the mobile terminal 22.

The transceiver 36 typically includes a transmitter circuit 44 and a receiver circuit 46, which respectively transmit outgoing radio frequency signals to the base station transceiver 24 and receive incoming radio frequency signals, such as voice call and data signals, from the base station transceiver 24 via an antenna 48. The antenna 48 may be an embedded antenna, a retractable antenna or any antenna known to those having skill in the art without departing from the scope of the present invention. The radio frequency signals transmitted between the mobile terminal 22 and the base station transceiver 24 may include both traffic and control signals (e.g., paging signals/messages for incoming calls), which are used to establish and maintain a voice call communication with another party or to transmit and/or receive data, such as e-mail or MMS messages, with a remote device. The processor 42 may support various functions of the mobile terminal 22, including functions related to the volume control circuit 29 of the mobile terminal 22 according to some embodiments of the present invention.

In some embodiments of the present invention, the base station transceiver 24 is a radio transceiver(s) that defines a cell in a cellular network and communicates with the mobile terminal 22 and other mobile terminals in the cell using a radio-link protocol. Although only a single base station transceiver 24 is shown, it will be understood that many base station transceivers may be connected through, for example, a mobile switching center and other devices, to define a wireless communications network. The transceiver 36 is configured to communicate with a data network using the wireless communications network 20.

According to some embodiments of the present invention, the volume control circuit 29 may be configured to adjust a volume of an output audio signal of the mobile terminal 22 based on both a power level of the output audio signal and a peak value of the output audio signal. Electronic devices according to some embodiments of the present invention, for example, mobile terminal 22, include the volume control circuit 29 to limit the volume of the mobile terminal 22 to a maximum allowed volume that will not damage a typical user's hearing even at the highest setting. Some embodiments of the present invention use two safety limits to determine the maximum allowed volume for the mobile terminal 22.

Figure 2:
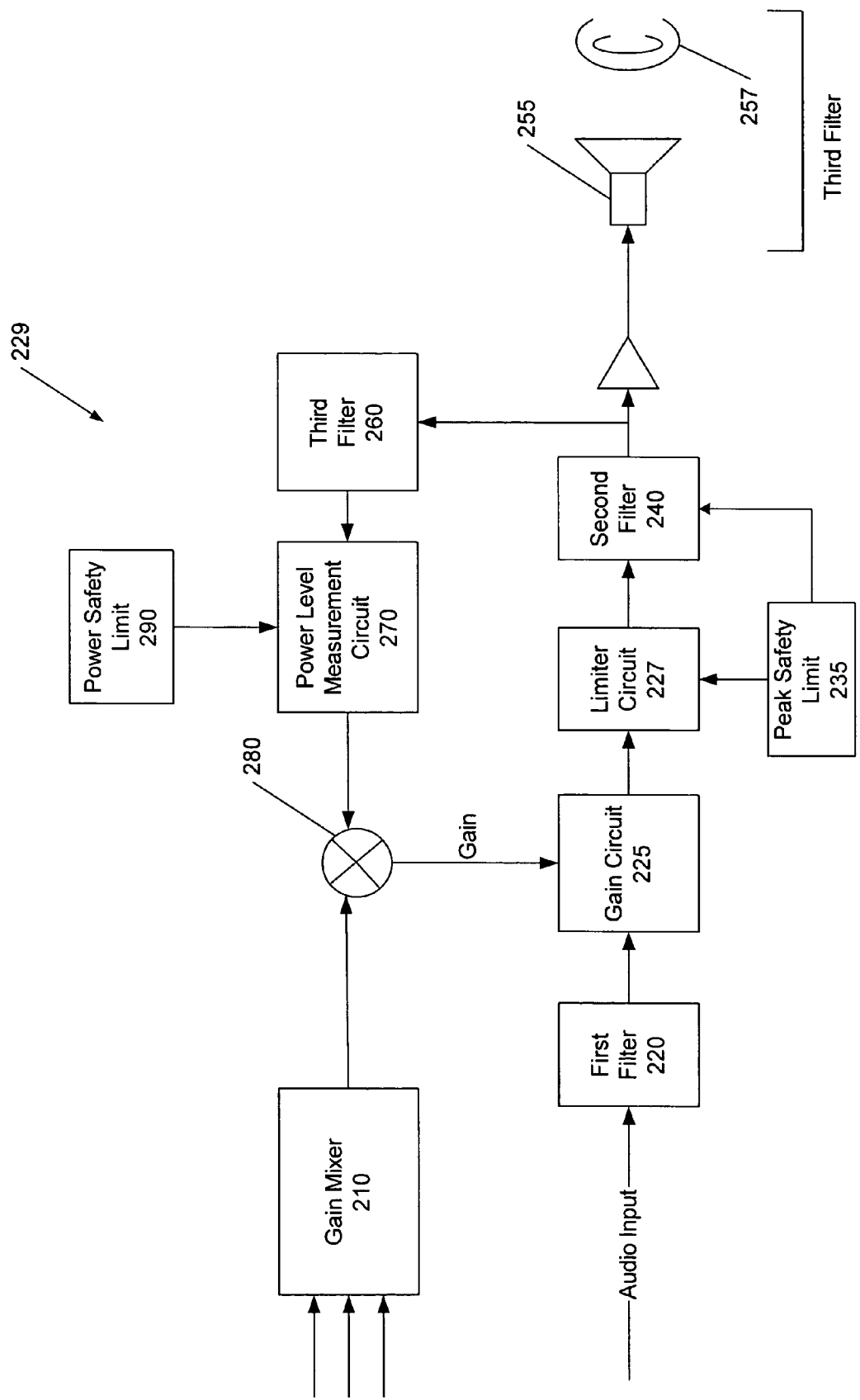
FIG. 2 is block diagram illustrating volume control circuits according to some embodiments of the present invention.

The first safety limit is the peak safety limit, which is the maximum magnitude that the output audio signal can have to be below the maximum allowed volume. If the peak of the output audio signal exceeds the peak safety limit, the output audio signal is limited to within the safety range as will be discussed further below. The second safety limit is the power safety limit, which is the maximum power that the output audio signal can have to be below the maximum allowed volume. If the power of the output audio signal is below the power safety limit, a gain of the volume control circuit may be adjusted to increase the volume of the output audio signal as will be discussed further below. Exemplary embodiments of volume control circuits according to some embodiments of the present invention will be discussed with respect FIGS. 2 and 3. Referring first to FIG. 2, as illustrated therein, volume control circuits 229 according to some embodiments of the present invention include a gain mixer 210, first, second and third filters, 220, 240 and 260, a gain circuit 225, a limiter circuit 227 having a peak safety limit 235, a power level measurement circuit 270 having a power safety limit 290 and a gain adjustment circuit 280. As further illustrated in FIG. 2, an input audio signal is received at the gain circuit 225 from the first filter 220. The gain circuit 225 is configured to receive an input audio signal and amplify the input audio signal based on the gain. In some embodiments of the present invention, the input audio signal may be divided into frames, for example, 5 ms frames. The gain adjustment circuit 280 may be further configured to adjust the gain once per frame. The gain may be fixed or adjustable without departing from the scope of the present invention. As illustrated, in some embodiments, the gain, which is partially determined by the gain mixer 210, may be a function of various dynamic factors and is not necessarily fixed. For example, the gain mixer 210 may be configured to dynamically change the gain with respect to environmental or background noise.

The limiter circuit 227 is configured to limit the amplified input audio signal based on the peak safety limit 235. The peak safety limit 235 may be set based on the acoustic filter, speaker and the like. The limiter circuit 227 is further configured to output an output audio signal having a peak value that is approximately equal to the peak safety limit, but does not exceed the peak safety limit.

It will be understood that although both a gain circuit 225 and a limiter circuit 227 are illustrated in FIG. 2, embodiments of the present invention are not limited to this configuration. For example, these blocks may be combined, or the order of them rearranged without departing from the scope of the present invention. In some embodiments of the present invention, the functionality of the gain circuit 225 and the limiter circuit 227 may be provided by a soft limiter (330 of FIG. 3), which will be discussed further below with respect to FIG. 3.

The power measurement circuit 270 is configured to measure the power level of the output audio signal from the limiter circuit 227 and determine if the power of the output audio signal exceeds the power safety limit 290. According to some embodiments of the present invention, the power level may be represented by an RMS power level, which involves mathematical computation. In further embodiments of the present invention, the power level may be represented by a filtered value of an absolute value of samples of the output audio signal, which may due away with some of the calculations involved in the RMS calculation.

In some embodiments of the present invention, the power measurement circuit 270 may be configured to provide a number between 0 and 1 to the gain adjustment circuit 280. For example, if the measured power of the output audio signal exceeds the power safety level 290, the power measurement circuit 270 may output a number between 0 and 1 to the gain adjustment circuit 280. If, on the other hand, the measured power of the output audio signal has not exceeded the power safety limit 290, the power measurement circuit 270 may output a 1 to the gain adjustment circuit 280. In some embodiments of the present invention, the functionality of the power measurement circuit 270 may be implemented with a min function.

The gain adjustment circuit 280 may be configured to adjust the gain of the gain circuit 225 responsive to the measured power level such that the power safety limit 290 is not exceeded. For example, in some embodiments of the present invention, the gain adjustment circuit 280 may be a multiplier. The gain adjustment circuit may multiply the gain from the gain mixer 210 by the output (0 to 1) of the power measurement circuit 270 and provide the adjusted gain to the gain circuit 225. In other words, the gain circuit 225 will amplify the signal based on the adjusted gain.

In some embodiments of the present invention, this adjustment may take place gradually so as to appear seamless to a user. In embodiments of the present invention where the RMS power representation is being used, the acoustic safety standards that specify the RMS power limits involve measurement over a period of time, such as two minutes. Thus, the slow change may be practical in these embodiments of the present invention. According to some embodiments of the present invention, both the peak safety limit and the power safety limit may be used to determine a volume of the output audio signal. Thus, users may be more satisfied with the loudness of the output audio signal as discussed herein.

As illustrated in FIG. 2, some embodiments of the present invention include a third filter 260 that is electrically coupled to an input of the power measurement circuit 270. The third filter 260 may be configured to provide a model/estimate of what the user is actually hearing. The filtered output audio signal may then be provided to the power measurement circuit 270. For each unique transducer, the third filter 260 may be loaded with the transfer function through the acoustic transducer to the user's ear. The third filter 260 may also include A-weighting since RMS (power) safety limits are typically expressed as A-weighted values at the user's ear.

FIG. 2 illustrates both an acoustic-model-based filter 255 and an A-weighted filter 257, i.e., the human ear, making up the third filter 260. However, some embodiments may include either the acoustic-model-based filter 255 or the A-weighted filter 257 without departing from the scope of the present invention. The presence of the third filter 260 may provide further accuracy of the RMS measurement, which may provide further loudness satisfaction for the users.

Figure 3:
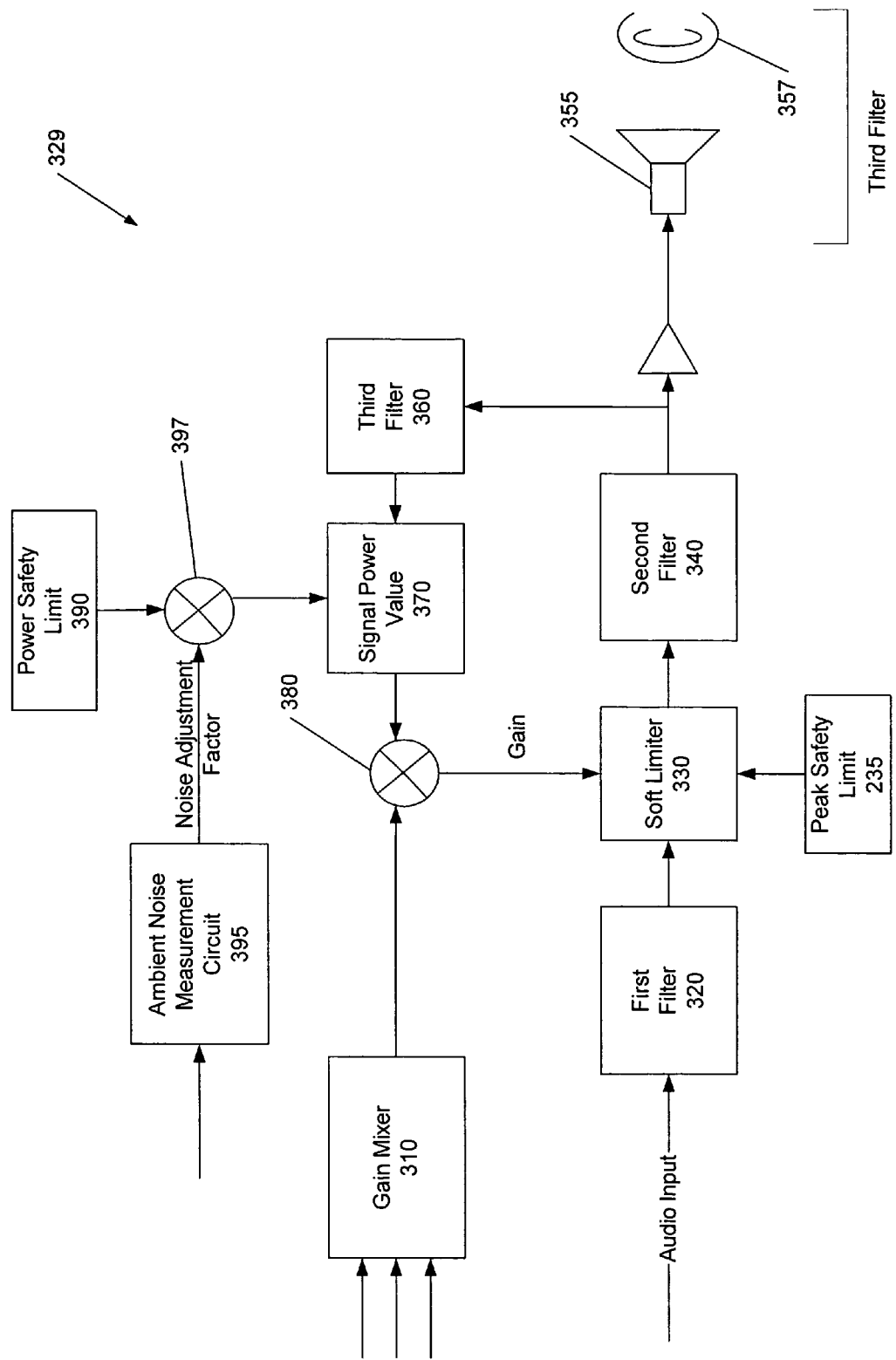
FIG. 3 is a block diagram illustrating volume control circuits according to further embodiments of the present invention.

Referring now to FIG. 3, further embodiments of volume control circuits according to some embodiments of the present invention will be discussed. Like numbered elements of FIGS. 2 and 3 have similar functionality and, therefore, the functionality of these elements will not be discussed further herein. Only the new aspects of FIG. 3 will be discussed. As illustrated therein, the gain circuit 225 and the limiter circuit 227 of FIG. 2 have been replaced by a soft limiter 330 in FIG. 3. The soft limiter 330 is configured to perform the functionality of both the gain circuit 225 and the limiter circuit 227 discussed above with respect to FIG. 2.

Soft limiters according to some embodiments of the present invention may be provided by soft limiters known to those having skill in the art. For example, in some embodiments of the present invention, the soft limiter may be provided by the soft limiters discussed in commonly assigned United States Patent Application Publication No. US 2006/0148435 entitled *Method and Apparatus for Multichannel Signal Limiting* to Romesburg, the disclosure of which is hereby incorporated herein by reference as if set forth in its entirety.

As further illustrated in FIG. 3, an ambient noise measurement circuit 395 and a safety limit adjustment circuit 397 are additionally provided in embodiments of the present invention illustrated therein. The ambient noise measurement circuit 395 may be configured to measure the ambient noise around the mobile terminal 22 and provide a noise adaptive factor based thereon. For example, the environmental noise coming into the microphone may be measured by the ambient noise measurement circuit 395 and a noise adjustment factor may be assigned to the noise level of the environment. For example, in some embodiments of the present invention, the noise adjustment factor may be a number between 1 and 4. This noise adjustment factor may be used to modify the power safety limit 390 to compensate for the ambient noise. For example, the noise adjustment factor may be provided to the safety adjustment circuit 397, which may be configured to adjust the power safety limit 390 of the power level of the output audio signal based on the noise adaptive factor. In some embodiments of the present invention, the safety adjustment circuit 397 may be a multiplier and the power safety limit may be multiplied by the noise adjustment factor to provide an adjusted power safety limit 390 for the volume control circuit. The adjusted power safety limit may then be used as discussed above.

It will be understood that the volume control circuits 229 and 329 illustrated in FIGS. 2 and 3, respectively, are provided for exemplary purposes only, and that embodiments of the present invention are not limited to these configurations.

Figure 4:
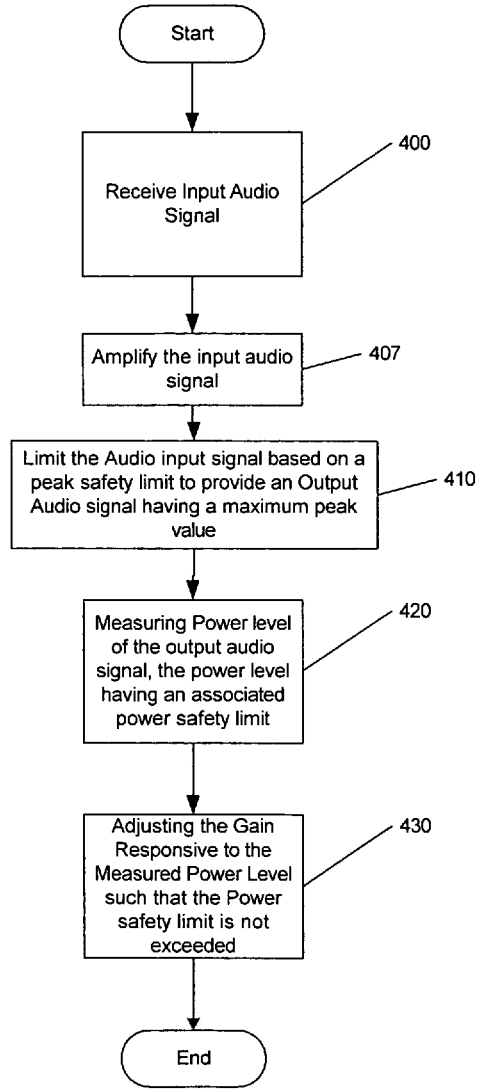
FIGS. 4 and 5 are flowcharts illustrating operations of volume control circuits according to various embodiments of the present invention.

Operations according to various embodiments of the present invention will now be discussed with respect to the flowcharts of FIGS. 4 and 5. Referring first to FIG. 4, operations for controlling volume in electronic devices begin at block 400 by receiving an input audio signal. The input audio signal may be amplified based on a gain (block 407) and amplified input audio signal may be limited based on a peak safety limit of the output audio signal (block 410). An output audio signal may be provided having a peak value, which in some embodiments of the present invention may be the maximum peak value.

A power level of the output audio signal may be measured (block 420). The power level may also have an associated power safety limit. In some embodiments of the present invention, the power level may be an RMS power level. In further embodiments of the present invention, the power level may be represented as a filtered value of an absolute value of samples of the output audio signal so as reduce computation that may be necessary when using the RMS power level. The gain may be adjusted responsive to the measured power level such that the power safety limit is not exceeded (block 430). The gain may be a function of various dynamic inputs or may be a fixed gain without departing from the scope of the present invention. Thus, according to some embodiments of the present invention, both the peak safety limit and the power safety limit may be used in determining the volume of the output audio signal, which may allow more user satisfaction with output volumes.

It will be understood that the operations of measuring and adjusting discussed above may be repeated until the power safety limit is reached to provide the maximum volume to the user upon request.

Figure 5:
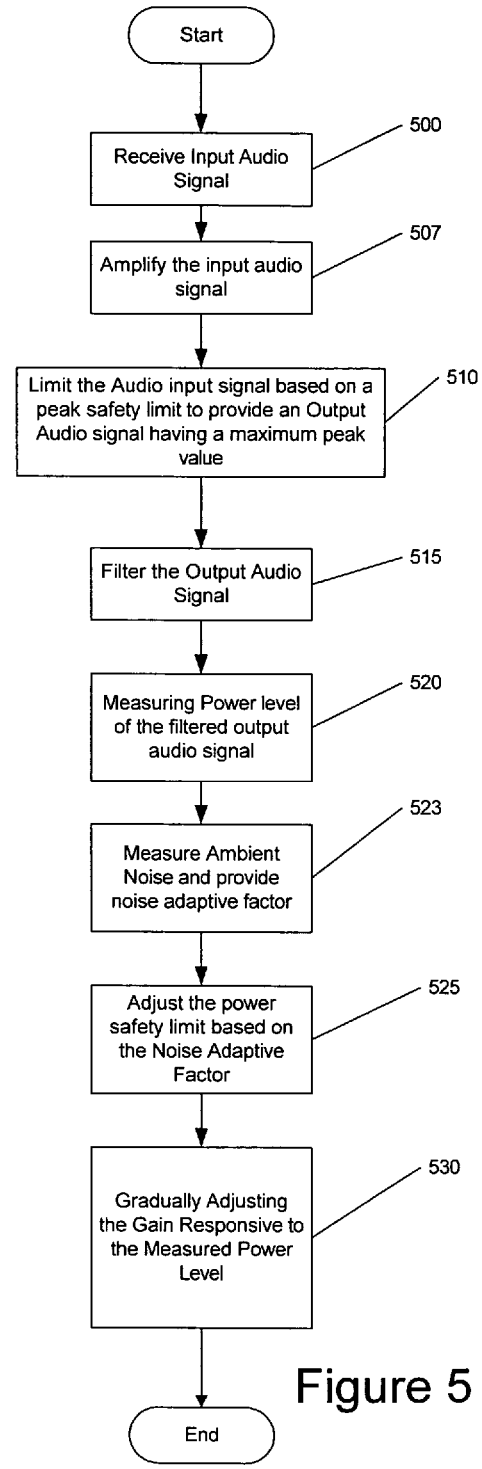

Referring now to FIG. 5, operations for controlling volume in electronic devices according to further embodiments of the present invention will be discussed. Operations begin at block 500 by receiving an input audio signal. The input audio signal may be amplified based on a gain (block 507) and amplified input audio signal may be limited based on a peak safety limit of the output audio signal (block 510). An output audio signal may be provided having a peak value, which in some embodiments of the present invention may be the maximum peak value, i.e., approximately equal to the power safety limit. The output audio signal may be filtered (block 515). The output audio signal may be acoustically filtered and/or A-weighted without departing from the scope of the present invention. The power level of the filtered output audio signal may be measured (block 520). Ambient or background noise may be measured and an associated noise adaptive factor may be provided (block 523). The power safety limit of the power level may be adjusted based on the noise adaptive factor (block 525). For example, in some embodiments of the present invention, the power safety limit may be multiplied by the noise adaptive factor to provide an adjusted power safety limit. The gain may be gradually adjusted responsive to the measured power level (block 530). In some embodiments of the present invention, the gain may be gradually adjusted such that the adjustment appears seamless to a user.

The drawings and specification, there have been disclosed typical illustrative embodiments of the invention and, although specific terms are employed, they are used in a That which is claimed is:

1. A volume control circuit for use in an electronic device comprising:
   a gain circuit configured to receive an input audio signal and amplify the input audio signal based on a gain;
   a limiter circuit configured to limit the amplified input audio signal based on a maximum peak safety limit indicating a maximum threshold for a volume of the electronic device and output an output audio signal having a peak value based on the maximum peak safety limit;
   a power measurement circuit configured to measure a power level of the output audio signal, the power level having an associated maximum power safety limit indicating a maximum threshold for the power level of the output audio signal; and
   a gain adjustment circuit configured to adjust the gain of the gain circuit responsive to the measured power level.

2. The volume control circuit of claim 1, wherein the gain adjustment circuit is further configured to adjust the gain of the gain circuit responsive to the measured power level such that the maximum power safety limit is not exceeded.

3. The volume control circuit of claim 1, further comprising a filter electrically coupled to an input of the power measurement circuit and configured to filter the output audio signal and provide the filtered output audio signal to the power measurement circuit.

4. The volume control circuit of claim 3, wherein the filter comprises an acoustic-model-based filter and/or an A-weighted filter.

5. The volume control circuit of claim 1, wherein the gain circuit and the limiter circuit are provided by a soft limiter.

6. The volume control circuit of claim 1, further comprising:
   an ambient noise measurement circuit configured to measure ambient noise and provide a noise adaptive factor; and
   a safety limit adjustment circuit configured to adjust the maximum power safety limit of the power level based on the noise adaptive factor.

7. The volume control circuit of claim 1, wherein the power level comprises a root mean square (RMS) power level.

8. The volume control circuit of claim 1, wherein the power level comprises a filtered value of an absolute value of samples of the output audio signal.

9. The volume control circuit of claim 1, wherein the gain of the gain circuit is a function of various dynamic inputs.

10. The volume control circuit of claim 1, wherein the gain adjustment module is further configured to gradually adjust the gain of the gain circuit responsive to the measured power level such that the adjustment appears seamless to a user.

11. The volume control circuit of claim 1, wherein the input audio signal is divided into frames and wherein the gain adjustment circuit is configured to adjust the gain once per frame.

12. A method for controlling volume in electronic devices comprising:
   receiving an input audio signal;
   amplifying the input audio signal based on a gain;
   limiting the amplified input audio signal based on a maximum peak safety limit indicating a maximum threshold for a volume of the electronic device and outputting an output audio signal having a peak value based on the maximum peak safety limit;
   measuring a power level of the output audio signal, the power level having an associated maximum power safety limit indicating a maximum threshold for the power level of the output audio signal; and
   adjusting the gain responsive to the measured power level.

13. The method of claim 12, wherein adjusting further comprises adjusting the gain responsive to the measured power level such that the maximum power safety limit is not exceeded.

14. The method of claim 12, wherein receiving comprises receiving the input audio signal in frames and wherein adjusting comprises adjusting the gain once per frame.

15. The method of claim 12, further comprising repeatedly measuring the power level and adjusting the gain until the maximum power safety limit has been reached but not exceeded.

16. The method of claim 12, further comprising filtering the output audio signal, wherein measuring further comprises measuring the power level of the filtered output audio signal.

17. The method of claim 16, wherein filtering comprises acoustically filtering the output audio signal and/or A-weighting the output audio signal.

18. The method of claim 12, further comprising:
   measuring ambient noise to provide a noise adaptive factor; and
   adjusting the maximum power safety limit of the power level based on the noise adaptive factor.

19. The method of claim 12, wherein the power level comprises a root mean square (RMS) power level.

20. The method of claim 12, wherein the power level comprises a filtered value of an absolute value of samples of the output audio signal.

21. The method of claim 12, wherein the gain is a function of various dynamic inputs.

22. The method of claim 12, wherein adjusting further comprises gradually adjusting the gain responsive to the measured power level such that the adjustment appears seamless to a user.

23. A volume control circuit for use in an electronic device comprising:
   a limiter circuit configured to receive an input audio signal and limit the input audio signal based on a maximum peak safety limit indicating a maximum threshold for a volume of the electronic device;
   a gain circuit configured to receive the limited input audio signal, amplify the input audio signal based on a gain and output an output audio signal;
   a power measurement circuit configured to measure a power level of the output audio signal, the power level having an associated maximum power safety limit indicating a maximum threshold for the power level of the output audio signal; and
   a gain adjustment circuit configured to adjust the gain of the gain circuit responsive to the measured power level such that the maximum power safety limit is not exceeded.

* * * * *